US007709860B2

(12) United States Patent
Dang et al.

(10) Patent No.: US 7,709,860 B2
(45) Date of Patent: May 4, 2010

(54) HIGH ELECTRON MOBILITY TRANSISTOR SEMICONDUCTOR DEVICE AND FABRICATION METHOD THEREOF

(75) Inventors: Linh Dang, Lawndale, CA (US); Wayne Yoshida, Hermosa Beach, CA (US); Xiaobing Mei, Manhattan Beach, CA (US); Jennifer Wang, Redondo Beach, CA (US); Po-Hsin Liu, Anaheim, CA (US); Jane Lee, Torrance, CA (US); Weidong Liu, San Marino, CA (US); Michael Barsky, Sherman Oaks, CA (US); Richard Lai, Redondo Beach, CA (US)

(73) Assignee: Northrop Grumman Space & Mission Systems Corp., Los Angeles, CA (US)

( * ) Notice: Subject to any disclaimer, the term of this patent is extended or adjusted under 35 U.S.C. 154(b) by 0 days.

(21) Appl. No.: 12/432,113

(22) Filed: Apr. 29, 2009

(65) Prior Publication Data

US 2009/0206369 A1 Aug. 20, 2009

Related U.S. Application Data

(62) Division of application No. 11/598,817, filed on Nov. 14, 2006, now Pat. No. 7,582,518.

(51) Int. Cl.
*H01L 29/778* (2006.01)
(52) U.S. Cl. .............................. 257/194; 257/E29.246

(58) Field of Classification Search .................. 257/194, 257/E29.246
See application file for complete search history.

(56) References Cited

U.S. PATENT DOCUMENTS

| 5,181,087 | A | 1/1993 | Usagawa et al. |
| 5,270,554 | A * | 12/1993 | Palmour ...................... 257/77 |
| 5,563,079 | A | 10/1996 | Shin et al. |
| 5,766,967 | A | 6/1998 | Lai et al. |
| 5,863,707 | A | 1/1999 | Lin |
| 6,270,929 | B1 | 8/2001 | Lyons et al. |
| 6,383,952 | B1 | 5/2002 | Subramanian et al. |
| 6,524,937 | B1 | 2/2003 | Cheng et al. |
| 6,548,401 | B1 | 4/2003 | Trivedi |
| 7,041,541 | B2 * | 5/2006 | Behammer .................. 438/182 |
| 7,220,628 | B2 | 5/2007 | Kon et al. |
| 7,608,497 | B1 * | 10/2009 | Milosavljevic et al. ...... 438/182 |
| 2003/0055613 | A1 | 3/2003 | Tsai |
| 2006/0186509 | A1 | 8/2006 | Larsen |

OTHER PUBLICATIONS

K. Sawada, K. Makiyama, T. Takahashi, K. Nozaki, M. Igarashi, J. Kon, N. Hara, "Fabrication of 0.1um-gate InP HEMTs using i-line lithography", International Conference on Indium Phosphide and Related Materials 2003, pp. 65-68.

(Continued)

*Primary Examiner*—Trung Dang
(74) *Attorney, Agent, or Firm*—Posz Law Group, PLC (57) ABSTRACT

In a method of forming a semiconductor device on a semiconductor substrate (100), a photoresist layer (102) is deposited on the semiconductor substrate; a window (106) is formed in the photoresist layer (102) by electron beam lithography; a conformal layer (108) is deposited on the photoresist layer (102) and in the window (106); and substantially all of the conformal layer (108) is selectively removed from the photoresist layer (102) and a bottom portion of the window to form dielectric sidewalls (110) in the window (106).

5 Claims, 7 Drawing Sheets

OTHER PUBLICATIONS

Toukhy, M., and Lu, P.H., "All i-line lift-off T-gate process and materials", International Conference on Compound Semiconductor Manufacturing Technology Digest 2005.

Nano PMMA and Copolymer [online]. MicroChem Corp. 2001 [retrieved on Nov. 13, 2006]. Retrieved from the Internet: <URL: www.nanotech.ucsb.edu/NanotechNew/processing/Lithography/Materials/PMMA.pdf>.

Ren, et al., "Fabrication of Y-gate, submicron gate length GaSa metal-semiconductor field effect transistors," Journal of Vacuum Science and Technology, Part B, vol. 11, No. 6, Nov. 1, 1993, pp. 2603-2606.

Malmkvist, et al. "A 50-nm gate length InP pseudomorphic HEMT implemented in an MMIC broadband feedback amplifier," 2004 International Conference on Indium Phoshide and Related Materials, May 31, 2004, pp. 386-388.

European Search Report issued from the European Patent Office for the corresponding European patent application to the parent application, No. 07018243.1 dated Mar. 16, 2009.

* cited by examiner

HIGH ELECTRON MOBILITY TRANSISTOR SEMICONDUCTOR DEVICE AND FABRICATION METHOD THEREOF

This application is a divisional of U.S. patent application Ser. No. 11/598,817, filed on Nov. 14, 2006 and entitled HIGH ELECTRON MOBILITY TRANSISTOR SEMICONDUCTOR DEVICE AND FABRICATION METHOD THEREOF, the disclosure of which is incorporated herein by reference.

TECHNICAL FIELD

The technical field relates generally to semiconductor device fabrication methods and, more particularly, to semiconductor device fabrication methods using lithographic techniques.

BACKGROUND

Future imaging and communication systems will extend the need for higher frequency and bandwidth devices and circuits beyond current device capabilities. The current generation of millimeter wave (mmW) transceivers and imagers are operable at frequency bands between 50-120 GHz. Further, mmW components, such as amplifiers, operable in G-band frequencies (140-220 GHz) have also been developed.

Lithography techniques such as electron beam lithography (EBL) and X-ray lithography are conventionally used in semiconductor device fabrication processes to manufacture mmW semiconductor devices. In an EBL semiconductor fabrication process, a semiconductor wafer is first coated with a photoresist and a window pattern is developed and made in the photoresist by an electron beam (e-beam). A metal is deposited in the window pattern and over the photoresist. The photoresist is then stripped or lifted off from the wafer so that only the gate metal remains. The EBL semiconductor fabrication process can achieve a gate having a gate capacitance sufficiently low for high frequency applications, such as the mmW transceivers discussed briefly above.

The next generation of technologies will operate in the sub-millimeter wave to provide benefits such as higher available bandwidth, reduced radar aperture and instrument size, and narrowed beam widths for radar and remote sensing applications by utilizing frequencies from 300 GHz to 3 THz.

However, conventional semiconductor device fabrication processes, such as the EBL semiconductor device fabrication process discussed above, cannot alone manufacture semiconductor devices such as transistors suitable for sub-millimeter wave operation. Particularly, the EBL semiconductor fabrication process cannot achieve a transistor gate having a gate capacitance sufficiently low enough for operating in frequencies from 300 GHz to 3 THz.

Further, in addition to imaging and communication systems, there is a continuing trend in the semiconductor industry toward higher device densities. To achieve these high densities there have been, and continue to be, efforts toward scaling down device dimensions at submicron levels on semiconductor wafers. In order to accomplish such high device packing density, smaller and smaller feature sizes are required.

It would be desirable to have an EBL semiconductor device fabrication process that would enable the manufacture of semiconductor devices suitable for sub-millimeter wave operation. It would be further desirable for such an EBL semiconductor fabrication process to also satisfy the production efficiency and complexity levels of current semiconductor device fabrication processes for manufacturing mmW components. It would be further desirable for such an EBL semiconductor device process to have repeatability and robustness in a manufacturing environment.

SUMMARY

The present disclosure concerns a semiconductor device fabrication method in which a photoresist layer is formed on a semiconductor substrate such as, for example, an indium phosphide (InP) substrate. A window is formed in the photoresist layer by electron beam lithography (EBL); a conformal layer comprised of a dielectric material is formed on the photoresist layer and in the window; and substantially all of the conformal layer is selectively removed from the photoresist layer and a bottom portion of the window to form dielectric sidewalls in the window.

The photoresist layer can include a polymethyl methacrylate (PMMA) layer on the semiconductor substrate and a PMMA-MAA copolymer layer on the PMMA layer. The conformal layer can be formed by depositing the dielectric material at a temperature and power at which the PMMA layer and the PMMA-MAA copolymer layer do not flow. The dielectric material can include silicon nitride (SiN).

Substantially all of the conformal layer can be selectively removed from the photoresist layer and a bottom portion of the window by applying a directional etch such as an anisotropic inductive coupled plasma (ICP) etch to the conformal layer at a radio frequency (RF) bias power between 10-50 W to control plasma energy and at an RF ICP power between 100-500 W to control ion generation.

A metal film can be deposited in the window and on the photoresist layer. The metal film comprises one of titanium, platinum and gold. The photoresist layer can then be lifted off to form a metal T-gate from the metal film. The window can be isotropically etched to remove a portion of the conformal layer from the dielectric sidewalls of the window prior to lifting off the photoresist layer.

The present disclosure also concerns a method of forming a metal T-gate on a Group III-V semiconductor substrate, a PMMA layer deposited on the semiconductor substrate, a PMMA-MAA copolymer layer deposited on the PMMA layer, and a window in the PMMA-MAA copolymer layer and the PMMA layer formed by EBL. The method comprises depositing a dielectric layer on the PMMA-MAA copolymer layer and over the window; selectively removing the dielectric layer to leave dielectric sidewalls in the window; depositing a metal film in the window by evaporation; and lifting off the PMMA layer and the PMMA-MAA copolymer layer to thereby form the metal T-gate from the metal film.

The selectively removing of the dielectric layer to leave dielectric sidewalls in the window can further include applying an ICP etch to the dielectric layer.

Prior to lifting off the PMMA layer and the copolymer layer, the dielectric layer can be partially removed from a portion of the PMMA layer by an isotropic reactive ion etch. The dielectric layer can include SiN.

The present disclosure also concerns a high electron mobility transistor (HEMT) device for a sub-millimeter wave amplifier operating in frequencies from 300 GHz to 3 THz. The HEMT device comprises: a group III-V substrate; a first source electrode and a second source electrode disposed on the substrate; a drain electrode disposed on the substrate; and a first metal gate finger disposed between the first source electrode and the drain electrode, and a second metal gate finger disposed between the drain electrode and the source electrode, the first and second metal gate fingers each comprising a metal T-gate having a width less than approximately 50 nm and greater than 0 nm.

The substrate can be an indium phosphate substrate with an $In_{0.75}Ga_{0.25}As$ channel. Each of the first and second metal gate fingers can be the metal T-gate comprising one of titanium, platinum and gold and having a width of approximately 35 nm. The metal T-gate includes sidewall portions composed of a dielectric material.

BRIEF DESCRIPTION OF THE DRAWINGS

The accompanying figures where like reference numerals refer to identical or functionally similar elements throughout the separate views and which together with the detailed description below are incorporated in and form part of the specification, serve to further illustrate various embodiments and to explain various principles and advantages all in accordance with the present invention.

DETAILED DESCRIPTION

Various embodiments of a semiconductor device and a fabrication method thereof will be discussed with reference to the drawings in which like numbers reference like components, and in which a single reference number may be used to identify an exemplary one of multiple like components.

Referring to FIGS. 1A-1D, a semiconductor device fabrication method for forming a semiconductor device will be discussed. A semiconductor device can be fabricated on a semiconductor substrate such as, for example, a silicon substrate, or a Group III-V semiconductor substrate, such as, for example, gallium nitride (GaN) or indium phosphide (InP).

Figure 1A:
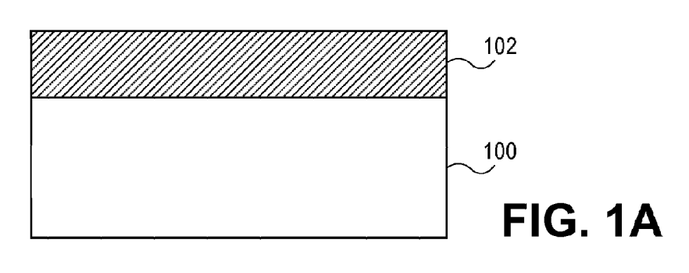
FIGS. 1A-1D are diagrams illustrating a semiconductor device fabrication method according to various embodiments.

Initially, as shown in FIG. 1A, a photoresist layer 102 is formed on the semiconductor substrate 100. The photoresist layer 102 can be, for example, a two-layer photoresist film composed of polymethylmethacrylate (PMMA) film and a copolymer film formed on the PMMA film. However, the photoresist layer 102 is not limited to PMMA, and may be composed of, for example, naphthoquinonediazine/novolak (AZ1450J), polyhexafluorobutylmethacrylate (FBM-120), polybutenesulfone (PBS), polyglycidylmethacrylate (COP) or chlorinated polymethylstyrene (CPMS).

The photoresist layer 102 can be formed on the semiconductor substrate 100 by, for example, depositing the PMMA film and copolymer film successively on the semiconductor substrate 100 while it is spinning at a high speed. However, any photoresist formation process can be used as long as it results in the semiconductor substrate 100 being evenly coated with the photoresist layer 102. Subsequently, as those skilled in the art will appreciate, the photoresist layer 102 can be soft-baked to drive out traces of solvent.

Figure 1B:
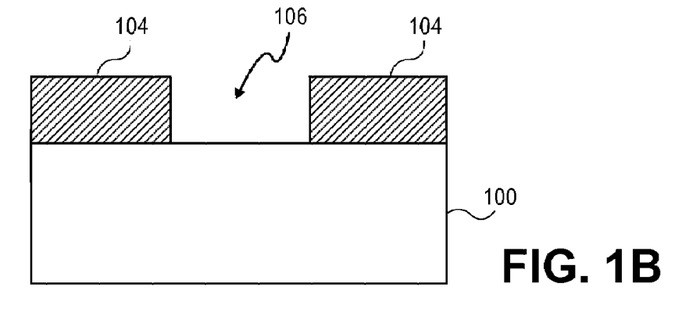

Referring to FIG. 1B, electron beam (e-beam) lithography (EBL) is applied to the photoresist layer 102 to form a window 106 in the photoresist layer 102 and to convert the photoresist layer 102 into mesas 104. For example, the e-beam can be applied directly (direct writing) to the photoresist layer 102 to form the window 106. Alternatively, a self-supporting mask can be used with a flood electron gun source which provides a collimated beam of electrons. The mask can then be imaged directly on the photoresist layer 102 to thereby form the window 106. The minimum size of a window that can be achieved by EBL is limited by, for example, the wavelength and light-gathering power of the lens. Direct e-beam writing by EBL alone can achieve a window having a minimum size value of 150 nm. However, this minimum size value is not sufficiently low for semiconductor devices intended to be implemented within a sub-millimeter wave component.

Figure 1C:
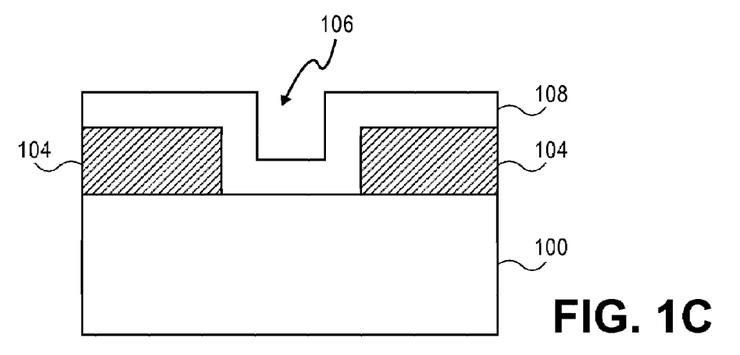

Referring to FIG. 1C, conformal deposition of a dielectric material on the mesas 104 and in the window 106 is performed to form a conformal layer 108 thereon. The dielectric material can include, for example, one of silicon nitride (SiN), silicon dioxide ($SiO_2$), or any other material suitable as an insulator highly resistant to electric current. The dielectric material can be deposited by, for example, chemical vapor deposition (CVD), or plasma-enhanced CVD. Also, the conformal layer 108 can also be formed by thermal growth of the dielectric material on the semiconductor substrate 100. For example, if the substrate 100 is a silicon substrate, the conformal layer 108 can be a $SiO_2$ dielectric layer grown by epitaxial growth. A SiN dielectric layer can also be grown by exposing silicon to ammonia at temperatures between 1000° C. and 1100° C.

Generally, a variety of deposition or thermal growth techniques may be used to form the conformal layer 108. However, the conformal layer 108 should be formed at a temperature and power at which the photoresist film of the mesas 104 does not flow. For example, PMMA has a low sensitivity ($3*10^{-5}$ $C/cm^2$ for a 20-keV beam) and a tendency to flow at elevated temperatures. Therefore, if the photoresist layer 102 (and thus the mesas 104) includes PMMA, then the dielectric material of the conformal layer 108 should be deposited at a temperature and power that is not higher than the maximum non-flow temperature and non-flow power of PMMA, which can be 90° C.

Figure 1D:
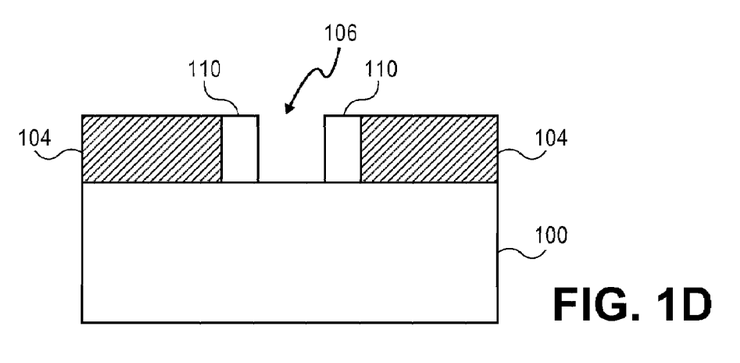

Referring to FIG. 1D, substantially all of the conformal layer 108 is selectively removed from above the mesas 104 and a bottom portion of the window 106 to thereby form dielectric sidewalls 110 in the window 106. As a result, the width of the window 106 shrinks and the width of the mesas 104 grows. The conformal layer 108 on the mesas 104 and in the window 106 can be selectively etched by, for example, directional etching. For example, an anisotropic inductive coupled plasma (ICP) etch can be applied to the conformal layer 108 at a first radio-frequency (RF) bias power to control the plasma energy and at a second RF ICP power to control ion generation by a plasma system. Plasma systems use RF excitation to ionize a variety of source gases in a vacuum system. The RF power source typically operates at a frequency of 13.56 MHz, which is set aside by the Federal Communications Commission (FCC) for industrial and scientific purposes. However, the plasma system can also operate at frequencies as low as a few hundred kilohertz, and microwave excitation is in use in certain systems.

The directional etch should be applied at a power at which the photoresist layer 102 does not flow. Therefore, if the photoresist layer 102 (and thus the mesas 104) includes PMMA, then the first RF bias power can be, for example, between 10-50 W to control plasma energy and the second RF ICP power can be, for example, between 100-500 W to control ion generation.

Thereby, the novel semiconductor device fabrication method shown in FIGS. 1A-1D can form a semiconductor substrate having a window 106 with dielectric sidewalls 110. The dielectric sidewalls 110 can provide a window 106 having a size that is significantly smaller than the minimum size value achieved solely by EBL. As a result, the window 106 is sufficient for fabricating semiconductor devices intended to be implemented within a sub-millimeter wave component. Particularly, the window 106 can be used in subsequent fabrication steps to form Schottky contacts, such as metal T-gates discussed below, having a capacitance sufficiently low for operation in frequencies from 300 GHz to 3 THz.

Referring to FIGS. 2A-2F, a semiconductor device fabrication method for fabricating a metal T-gate will be discussed. The metal T-gate can be used as one of the fingers 404, 408 of the high electron mobility transistor (HEMT) device 400 shown in FIG. 4A.

Figure 2A:
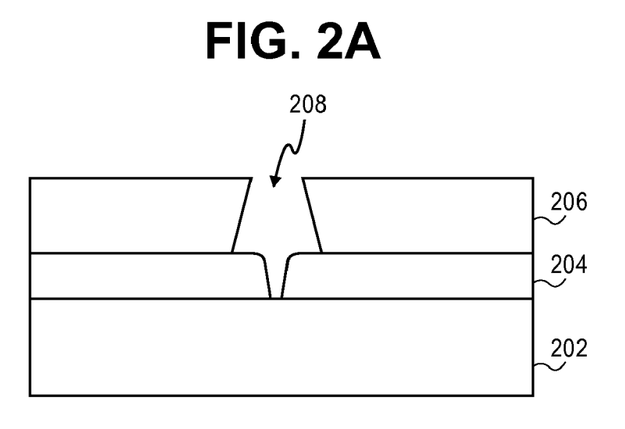
FIGS. 2A-2F are diagrams illustrating a semiconductor device fabrication method for fabricating a metal T-gate.
Figure 3A:
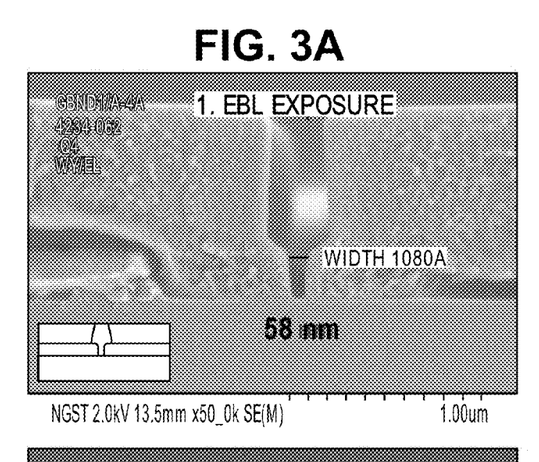
FIGS. 3A-3D are scanning electron micrograph images showing a portion of the semiconductor device fabrication method for fabricating the metal T-gate.

Referring to FIG. 2A, a two-layer photoresist film composed of a PMMA layer 204 and a PMMA-MAA (Meth-Acrylic Acid) copolymer layer 206 is deposited on a Group III-V semiconductor substrate 202. The semiconductor substrate 202 is preferably an InP substrate. However, other semiconductor substrates sufficient for forming HEMT devices can be used. The PMMA layer 204 can include, for example, 4% PMMA and the PMMA-MAA copolymer layer 206 can include, for example, 12% PMMA. The PMMA layer 204 and the PMMA-MAA copolymer layer 206 have different dissolution rates during EBL as a result of the different molecular weights. Generally, the dissolution rate increases as molecular weight increases. Thereby, window formation by EBL results in a window 208 having a profile in which the width is comparatively narrow in the PMMA layer 204 then in the PMMA-MAA copolymer layer 206. That is, the window 208 includes a narrow portion in the PMMA layer 204. Further, as shown in FIG. 3A, the width of the narrow portion of the window 208 in the PMMA layer 204 is approximately 108 nm, which is smaller than the minimum size value of 150 nm achieved solely by direct e-beam writing in a photoresist layer composed of a single film.

Figure 2B:
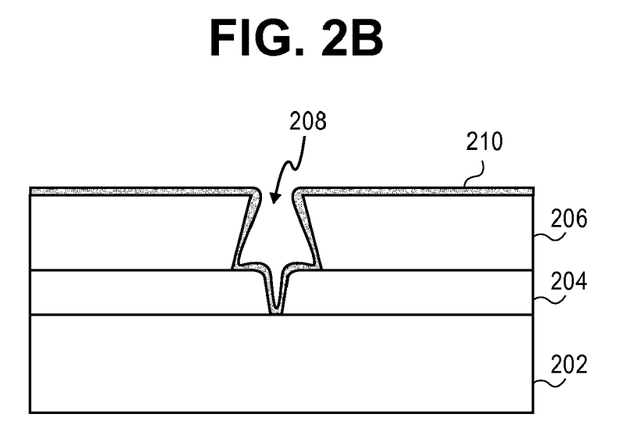
Figure 3B:
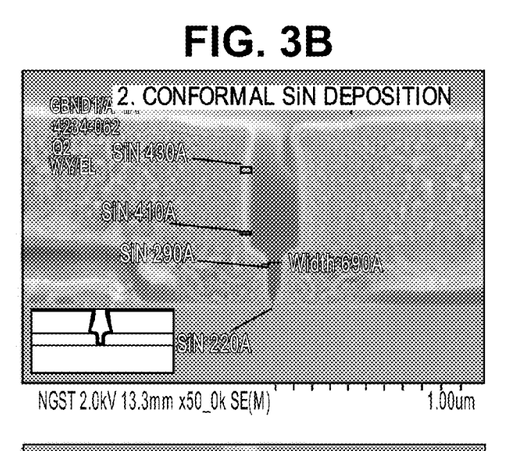

Referring to FIG. 2B, a dielectric layer 210 is conformally deposited on the PMMA-MAA copolymer layer 206 and over the window 208. The dielectric layer 210 can be, for example, SiN, and can be deposited by, for example, CVD. However, the SiN should be deposited at a temperature and a power that is lower than the temperature and power at which the PMMA layer 204 and the PMMA-MAA copolymer layer 206 flows. As shown in FIG. 3B, the width of the narrow portion of the window 208 in the PMMA layer 204 is minimized to approximately 69 nm by the dielectric layer 210.

Figure 2C:
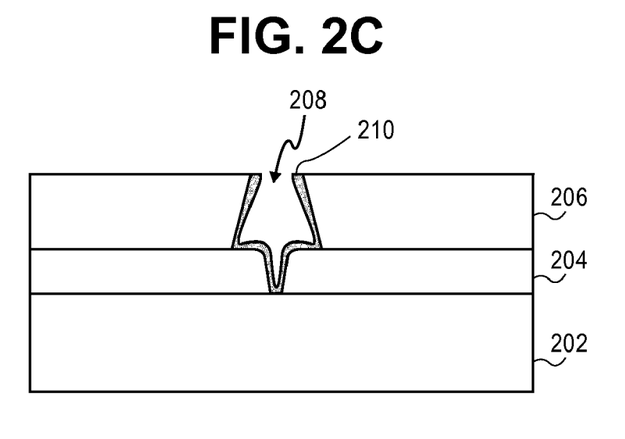
Figure 3C:
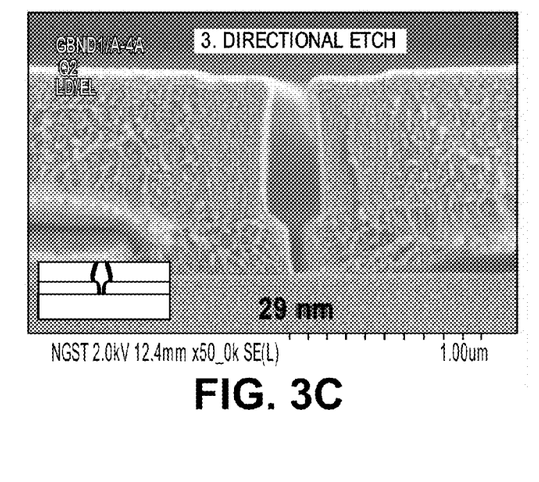

Referring to FIG. 2C, the dielectric layer 210 is selectively removed from the top of the PMMA-MAA copolymer layer 206 and the bottom of the window 208 to form dielectric sidewalls 212 in the window 208. The dielectric layer 210 can be selectively removed by applying a directional etch such as an anisotropic ICP etch to the dielectric layer 210 at a first RF bias power to control the plasma energy and at a second RF ICP power to control ion generation. However, the directional etch must be applied at a temperature and power at which the PMMA layer 204 and the PMMA-MAA copolymer layer 206 do not flow. The first RF bias power can be, for example, between 10-50 W to control plasma energy and the second RF ICP power can be, for example, between 100-500 W to control ion generation. As shown in FIG. 3C, the width of the narrow portion of the window 208 in the PMMA layer 204 including the dielectric sidewalls 212 can be minimized to approximately 29 nm after the directional etching.

Figure 2D:
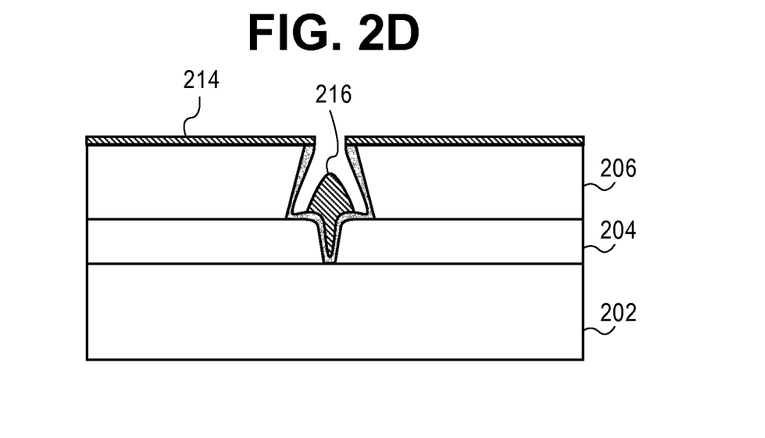
Figure 3D:
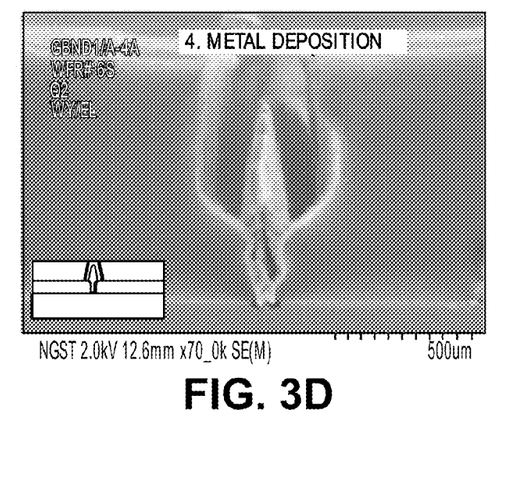

Referring to FIG. 2D, a metal film 214 is deposited on the PMMA-MAA copolymer layer 206 and in the window 208 to from a metal T-gate 216. The metal film 214 may be formed by an evaporation process in which a metal such as titanium, platinum and gold or a combination thereof is heated to the point of vaporization and then evaporated to form the metal film 214. The dielectric sidewalls 212 can substantially prevent the PMMA-MAA copolymer layer 206 and the PMMA layer 204 from flowing during the evaporation of the metal. Successful deposition of the metal film 214 in the window 208 is shown in FIG. 3D.

Figure 2E:
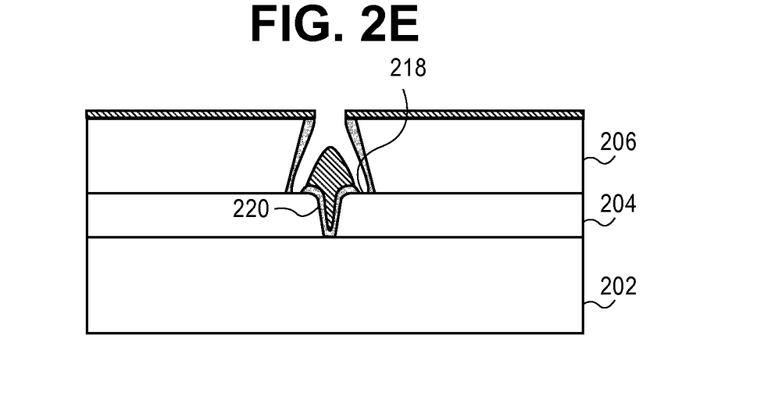

Referring to FIG. 2E, the dielectric sidewalls 212 in the window 208 can be optionally etched to remove the portion of the dielectric sidewalls 212 on a bottom portion 218 of the window 208 in the PMMA-MAA copolymer layer 206 from a portion 220 of the dielectric sidewalls 212 in the PMMA layer 204. The etching can be performed by, for example, reactive ion etching (RIE) or isotropic etching.

Figure 2F:
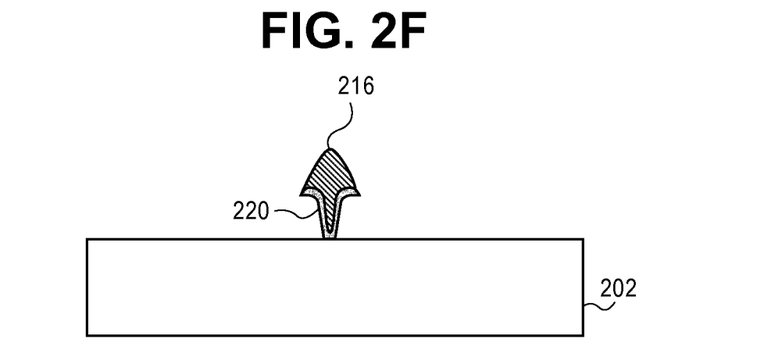

Referring to FIG. 2F, the PMMA layer 204 and the PMMA-MAA copolymer layer 206 are lifted off from the semiconductor substrate 202 to thereby form the metal T-gate 216. The PMMA layer 204 and the PMMA-MAA copolymer layer 206 can be lifted off by, for example, application of a liquid stripper or chemical solvent such as, for example, acetone or methylethylketone, or by oxidizing the PMMA layer 204 and the PMMA-MAA copolymer layer 206 in an oxygen plasma system.

Thereby, the novel semiconductor fabrication method shown in FIGS. 2A-2F can form the metal T-gate 216 having a width less than 50 nm, which is substantially smaller than the minimum value provided by EBL alone. Further, as will be discussed more fully below, the metal T-gate 216 has a gate capacitance sufficiently low enough to permit use in a semiconductor device for a sub-millimeter wave amplifier operating in frequencies from 300 GHz to 3 THz.

Further, evaporation of the metal film 214 and lifting off of the PMMA layer 204 and the PMMA-MAA copolymer layer 206 result in the metal T-gate 216 having a wedge-like base to the gate, forming a thin point close to the top of the gate stem. However, the dielectric sidewalls 220 preserve the mechanical stability of the metal T-gate 216 during high-force processes between metallization and passivation of the dielectric layer 210 which can introduce considerable torque on the metal T-gate 216, thereby causing it to bend at the thin point. Further, the dielectric sidewalls 220 eliminate the need for support structures that can introduce parasitic capacitances and degrade device performance and greatly increase the complexity and number of steps in the overall gate fabrication process.

The novel semiconductor device fabrication method shown in FIGS. 2A-2F has comparable complexity to conventional 100-150 nm HEMT device gate fabrication processes, thereby suggesting that wafer throughput for the metal T-gate on InP HEMT wafers can be sustained at the historical production level of approximately 100 wafers per week per EBL tool.

The device yield of semiconductor devices manufactured according to the novel semiconductor fabrication method shown in FIGS. 2A-2F was tested to determine the percentage of test devices that exceeded a device yield set to a nominal threshold of 1000 mS/mm at 1V for peak transconductance ($G_{mp}$). Particularly, the device yield over 12 wafers processed in several distinct lots was determined. The test device results demonstrated the repeatability and robustness of the process in a manufacturing environment. The average yield for the process was approximately 85%, with some wafers yielding as high as 98% of devices tested.

Gate length control and alignment are also key parameters that were tracked for variability. Variation in gate length would cause $C_{gs}$ variations that could limit device performance. Average gate lengths for devices on each wafer, determined indirectly from Critical Dimension—Scanning Electron Microscopy (CDSEM), were found to be well controlled and for the most part varied only +/−3 nm between wafers.

Although the novel semiconductor fabrication method discussed above and shown in FIGS. 2A-2F used a two-layer photoresist film composed of a PMMA layer 204 and a PMMA-MAA copolymer layer 206, it should be noted that a multilayer photoresist film such as a tri-layer photoresist film having a PMMA-MAA copolymer layer sandwiched between two PMMA layers can also be used.

Figure 4A:
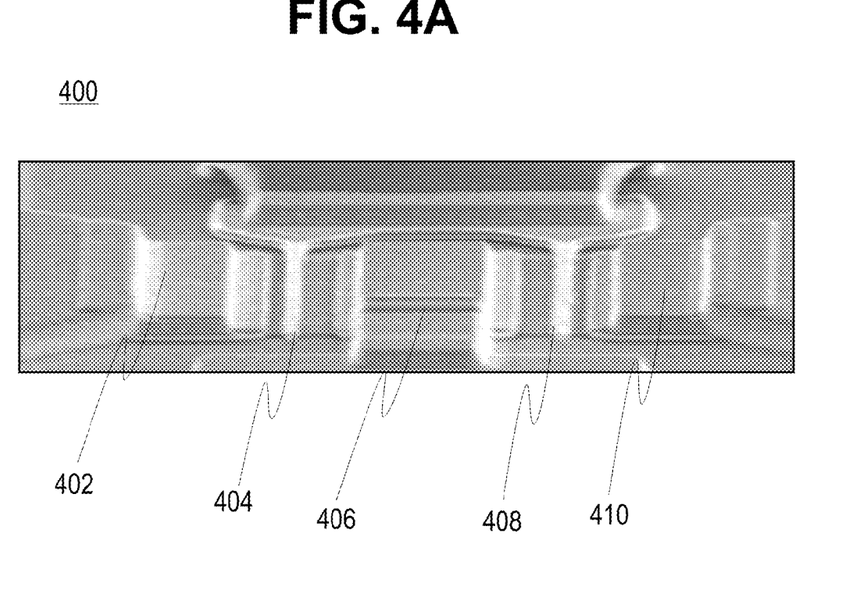
FIG. 4A is a scanning electron micrograph image of an exemplary two finger high electron mobility transistor (HEMT) device fabricated according to the method shown in FIGS. 2A-2F.

Referring to FIG. 4A, a semiconductor device 400 having metal gate fingers manufactured by the semiconductor device fabrication method shown in FIGS. 2A-2F will be discussed. The semiconductor device 400 is a high electron mobility transistor (HEMT) formed on a Group III-V substrate, preferably an InP substrate with an $In_{0.75}Ga_{0.25}As$ channel. The HEMT device 400 is for a sub-millimeter wave amplifier operating in frequencies from 300 GHz to 3 THz. The HEMT 400 includes a first source electrode 402, a drain electrode 406 and a second source electrode 410 disposed on the substrate. A first metal gate finger 404 is disposed between the first source electrode 402 and the drain electrode 406, and a second metal gate finger 408 is disposed between the drain electrode 406 and the source electrode 410.

Figure 4B:
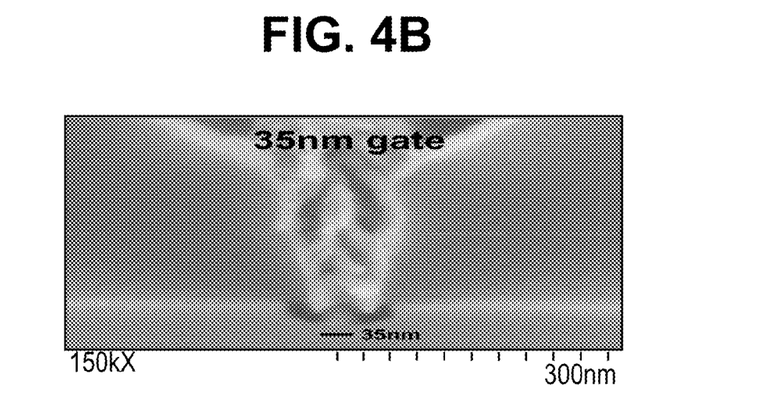
FIG. 4B is a scanning electron micrograph image of the metal T-gate of the HEMT device of FIG. 4A.

The first and second metal gate fingers 404, 408 are each formed from the metal T-gate formation process shown in FIGS. 2A-2F to thereby include a metal T-gate having a width less than approximately 50 nm and greater than 0 nm. Particularly, as shown in FIG. 4B, each of the metal gate fingers has a width of approximately 35 nm. The first and second metal gate fingers 404, 408 are composed of a metal such as titanium, platinum, gold or a combination thereof. Further, as shown in, for example, FIG. 2F, each of the gate fingers 404, 408 can include sidewall portions composed of a dielectric layer such as SiN.

The 35 nm metal T-gate has a gate capacitance ($C_{gs}$) that is significantly low in comparison to the gate capacitance of metal T-gates fabricated by conventional EBL. For example, a measured gate capacitance of the 35 nm metal T-gate was approximately 0.083 pF. In comparison, the measured gate capacitance of a 70 nm metal T-gate manufactured by conventional EBL without the benefit of the dielectric sidewalls was 0.126 pF. That is, forming a 35 nm metal T-gate according to the novel semiconductor fabrication method discussed above lead to a 35% reduction in gate capacitance.

Electrical validation of the two finger HEMT device 400 with the 35 nm metal T-gate was determined both through DC and RF measurements. The DC characteristics of the device 400 were excellent, with typical $G_{mp}$ at 1V operation of 1500 mS/mm. Good device pinchoff and output conductance were also achieved, with typical measured output conductance of 300 mS/mm, pinchoff current less than 5 mA/mm, and gate leakage less than −0.2 mA/mm at 2V gate-drain voltage.

Figure 5A:
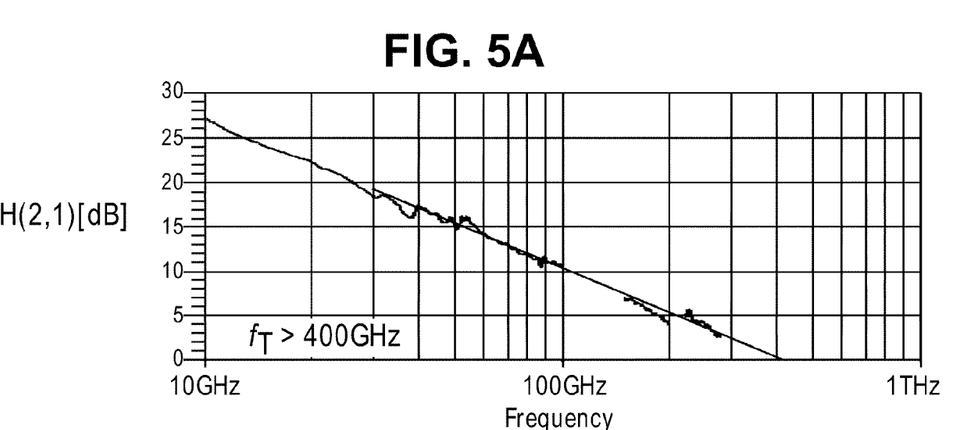
FIGS. 5A-5B are diagrams illustrating RF measurements across 1 to 300 GHz on the two finger HEMT device of FIG. 4A.
Figure 5B:
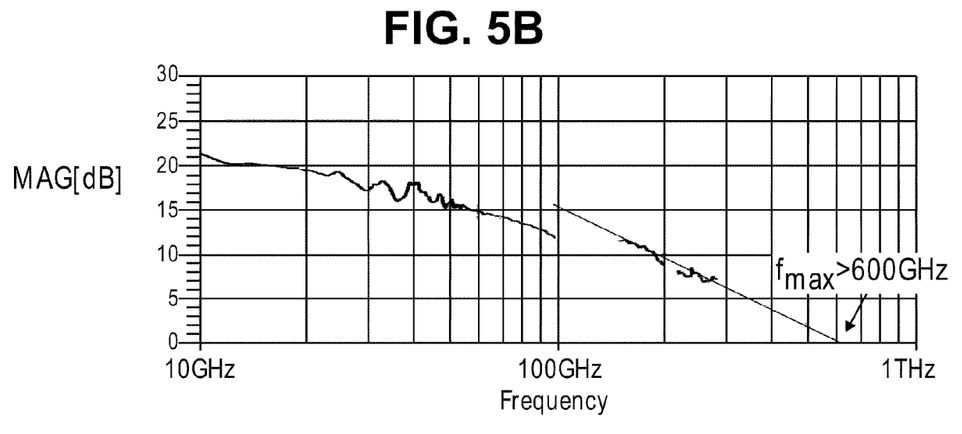

Referring to FIGS. 5A-5B, RF measurements were measured across 1 to 300 GHz on the two finger HEMT device 400 with extended coplanar reference planes at a drain voltage ($V_d$) of 1V and a drain current ($I_d$) of 9 mA. To obtain the broadband performance plots, measurements on three separate vector network analyzer (VNA) test sets were performed, including an XF probe station (1-100 GHz), a WR-5 based probe station (140-200 GHz) and a WR-3 based probe station (220-270 GHz). Measurements on three separate devices 400 were combined to form the total response due to the different probe footprints and calibration structures that are required to cover each section of the bandwidth. However, the measured S-parameter trends and the trends of maximum available gain (MAG) and forward current gain (H21) are well pronounced, supporting the validity of the measurement and suggesting good process control.

As shown in FIG. 5A, the RF measurements indicate that the cut-off frequency $f_T$ exceeds 400 GHz. Further, as shown in FIG. 5B, extrapolation of MAG down to unity gain with a −20 dB/decade slope suggests a maximum frequency $f_{max}$ exceeding 600 GHz. These measurements demonstrate a 40% improvement in $f_T$ achieved by reducing gate length from 70 nm to 35 nm by use of the dielectric sidewalls for reducing the gate width, in good agreement with the measured 35% reduction in $C_{gs}$ observed after decreasing the gate width.

Figure 6:
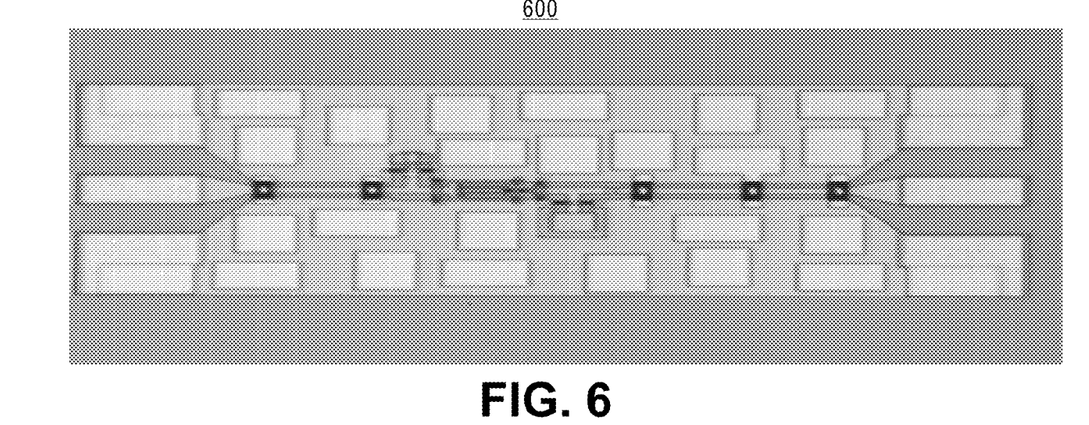
FIG. 6 is a microphotograph of a 308 GHz single stage amplifier incorporating the HEMT device of FIG. 4A.
Figure 7:
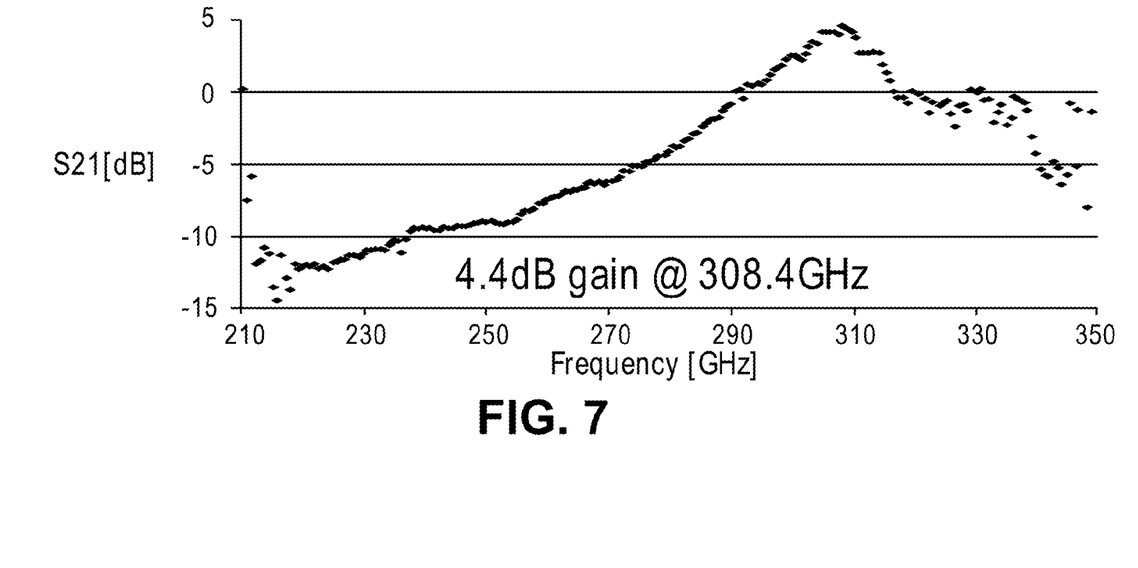
FIG. 7 is a diagram illustrating measured gain for the single stage amplifier of FIG. 6.

Referring to FIG. 6, a single stage sub-millimeter wave Monolithic Integrated Circuit (SMMIC) prematched amplifier 600 was designed and fabricated using the 2-finger HEMT device 400 in a common-gate configuration. The S-parameters of the amplifier were measured directly on a 25 mm wafer. Referring to FIG. 7, a 4.4 dB peak gain was measured at 308 GHz for the amplifier 600, making this, to the knowledge of the inventors of the present disclosure, the highest frequency gain amplifier reported to date and the first ever amplifier gain measured in the SMMW band >300 GHz.

The apparatuses and methods discussed above and the inventive principles thereof are intended to and will manufacture a semiconductor device having a gate capacitance sufficient for high frequency applications in a sub-millimeter wave device utilizing frequencies from 300 GHz to 3 THz. It is expected that one of ordinary skill given the above described principles, concepts and examples will be able to implement other alternative procedures and constructions that offer the same benefits. It is anticipated that the claims below cover many such other examples.

The invention claimed is:

1. A high electron mobility transistor (HEMT) device for a sub-millimeter wave amplifier operating in frequencies from 300 GHz to 3 THz, comprising:
   a group III-V substrate;
   a first source electrode and a second source electrode disposed on the substrate;
   a drain electrode disposed on the substrate; and
   a first metal gate finger disposed between the first source electrode and the drain electrode, and a second metal gate finger disposed between the drain electrode and the source electrode, the first and second metal gate fingers each comprising a metal T-gate having a width less than approximately 50 nm and greater than 0 nm.

2. The semiconductor device of claim 1, wherein the substrate further comprises an indium phosphate substrate with an $In_{0.75}Ga_{0.25}As$ channel.

3. The semiconductor device of claim 1, wherein each of the first and second metal gate fingers comprises the metal T-gate comprising one of titanium, platinum and gold.

4. The semiconductor device of claim 1, wherein each of the first and second metal gate fingers comprises the metal T-gate having a width of approximately 35 nm.

5. The semiconductor device of claim 1, wherein each of the first and second metal gate fingers comprises the metal T-gate, wherein the metal T-gate includes sidewall portions composed of a dielectric material.

* * * * *